(12) United States Patent  
Camacho et al.

(10) Patent No.: US 8,377,750 B2
(45) Date of Patent: Feb. 19, 2013

(54) INTEGRATED CIRCUIT PACKAGING SYSTEM WITH MULTIPLE ROW LEADS AND METHOD OF MANUFACTURE THEREOF

(75) Inventors: Zigmund Ramirez Camacho, Singapore (SG); Dioscoro A. Merilo, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 91 days.

(21) Appl. No.: 12/968,266

(22) Filed: Dec. 14, 2010

(65) Prior Publication Data

US 2012/0146203 A1 Jun. 14, 2012

(51) Int. Cl.
*H01L 21/00* (2006.01)
*H01L 23/495* (2006.01)

(52) U.S. Cl. ........ 438/123; 257/666; 257/672; 257/787; 257/E23.031; 257/E23.027; 257/E23.052; 257/E21.499

(58) Field of Classification Search .................. 438/111, 438/112, 123, FOR. 366, FOR. 367, FOR. 377, 438/FOR. 380; 257/666–677, E23.005–E23.009, 257/E23.041, E23.053–E23.055, E23.031–E23.059, 257/787, E21.499
See application file for complete search history.

(56) References Cited

U.S. PATENT DOCUMENTS

| | | | |
|---|---|---|---|
| 6,348,726 B1 | 2/2002 | Bayan et al. | |
| 6,548,328 B1* | 4/2003 | Sakamoto et al. | 438/121 |
| 6,630,729 B2 | 10/2003 | Huang | |
| 6,995,459 B2 | 2/2006 | Lee et al. | |
| 7,049,177 B1* | 5/2006 | Fan et al. | 438/123 |
| 7,060,535 B1 | 6/2006 | Sirinorakul et al. | |
| 7,087,461 B2* | 8/2006 | Park et al. | 438/112 |
| 7,262,491 B2* | 8/2007 | Islam et al. | 257/670 |
| 7,521,294 B2* | 4/2009 | Lee | 438/123 |
| 8,125,062 B2* | 2/2012 | Shoji et al. | 257/666 |
| 2003/0168719 A1* | 9/2003 | Cheng et al. | 257/666 |
| 2004/0097017 A1* | 5/2004 | Shimanuki | 438/124 |
| 2008/0258278 A1* | 10/2008 | Ramos et al. | 257/676 |

* cited by examiner

*Primary Examiner* — Jasmine Clark
(74) *Attorney, Agent, or Firm* — Ishimaru & Associates LLP; Mikio Ishimaru (57) ABSTRACT

A method of manufacture of an integrated circuit packaging system includes: forming a base structure having a die paddle, an outer lead, and an inner lead between the die paddle and the outer lead, with a pre-plated finish on a base structure system side of the base structure; mounting an integrated circuit device to a side of the die paddle opposite the paddle system side; attaching an interconnect to the integrated circuit device and a side of the inner lead opposite the inner lead system side; applying an encapsulation around the integrated circuit device, the interconnect, and the base structure with the pre-plated finish exposed from the encapsulation; and forming an inward channel in the encapsulation to electrically isolate the inner lead.

17 Claims, 6 Drawing Sheets

INTEGRATED CIRCUIT PACKAGING SYSTEM WITH MULTIPLE ROW LEADS AND METHOD OF MANUFACTURE THEREOF

TECHNICAL FIELD

The present invention relates generally to an integrated circuit packaging system, and more particularly to a system with multiple row leads.

BACKGROUND ART

Electronic products such as cell phone base products, global positioning systems (GPS), satellites, communication equipment, consumer products, and a vast line of other similar products are in ever increasing global demand. Market growth for high density and high output/input integrated circuit packages has resulted in a trend for electronic products that are lightweight, smaller in size, multi-functional, and capable of ever increasing higher speeds.

Products must be capable of competing in world markets and attracting many consumers or buyers. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages at a reduced cost with increases in product yields and product reliability.

Thus, an increasing need remains to increase manufacturing throughput and the product reliability while reducing costs as a result of manufacturing scrap and rework of parts. It is also critical that the smaller packages are easily manufactured using automated packaging machinery. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a base structure having a die paddle, an outer lead, and an inner lead between the die paddle and the outer lead, with a pre-plated finish on a base structure system side of the base structure; mounting an integrated circuit device to a side of the die paddle opposite the paddle system side; attaching an interconnect to the integrated circuit device and a side of the inner lead opposite the inner lead system side; applying an encapsulation around the integrated circuit device, the interconnect, and the base structure with the pre-plated finish exposed from the encapsulation; and forming an inward channel in the encapsulation to electrically isolate the inner lead.

The present invention provides an integrated circuit packaging system, including: a base structure having a die paddle, an outer lead, and an inner lead between the die paddle and the outer lead with a pre-plated finish on a base structure system side of the base structure; an integrated circuit device mounted to a side of the die paddle opposite the paddle system side; an interconnect attached to the integrated circuit device and a side of the inner lead opposite the inner lead system side; an encapsulation around the integrated circuit device, the interconnect, and the base structure, with the pre-plated finish exposed from the encapsulation; and an inward channel in the encapsulation to electrically isolate the inner lead.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings are shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
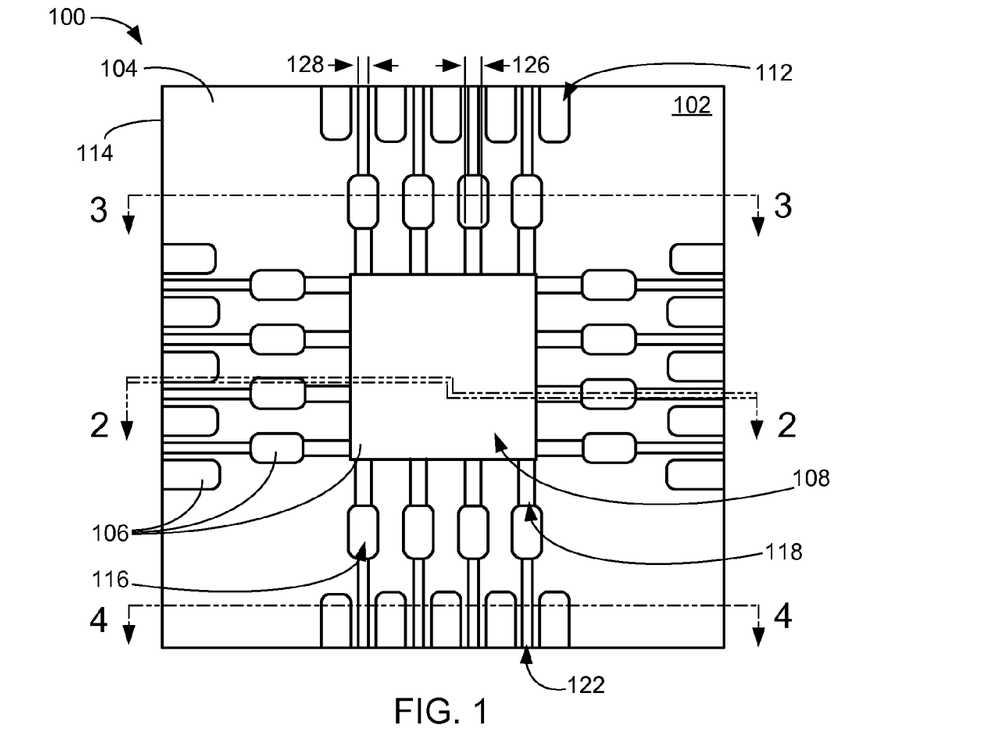
FIG. 1 is a bottom view of an integrated circuit packaging system in a first embodiment of the present invention.

Referring now to FIG. 1, therein is shown a bottom view of an integrated circuit packaging system 100 in a first embodiment of the present invention. The integrated circuit packaging system 100 includes an encapsulation 102 with a base surface 104 and a pre-plated finish 106 formed over different areas of the base surface 104 using conductive materials that can include Nickel, Palladium, gold, or in any combination with electrically conductive materials.

The encapsulation 102 is a covering to protect and hermetically seal the contents of the integrated circuit packaging system 100. The pre-plated finish 106 is applied on a material to protect the material from damage that can include chemical etchants, corrosion, oxidation, or abrasions.

The pre-plated finish 106 can be exposed at a component area 108 over the base surface 104 and at outer areas 112 along a perimeter of the integrated circuit packaging system 100. The pre-plated finish 106 at the outer areas 112 intersects encapsulation sides 114 of the integrated circuit packaging system 100. The component area 108 and each of the outer areas 112 are individually separated from one another by the base surface 104.

Offset areas 116 over the base surface 104 having the pre-plated finish 106 can be located between the component area 108 and the outer areas 112 along the perimeter. Each of the offset areas 116 are individually separated from one another, the component area 108, and the outer areas 112 by the base surface 104.

Inward channels 118 are formed in the encapsulation 102. Each of the inward channels 118 is defined as a groove or indentation formed from the base surface 104 into the encapsulation 102. A length of the inward channels 118 can extend perpendicularly from an edge of the pre-plated finish 106 at the component area 108 to an edge of the pre-plated finish 106 of the offset areas 116.

Outward channels 122 can be formed in the encapsulation 102. Each of the outward channels 122 can be defined as a groove or indentation formed from the base surface 104 into the encapsulation 102. A length of the outward channels 122 can extend perpendicularly from one of the encapsulation sides 114 to an edge of the pre-plated finish 106 of the offset areas 116. The outward channels 122 can extend to the edge of the offset areas 116 opposite the edge of the offset areas 116 with the inward channels 118.

An inward channel width 126 is defined as a perpendicular distance between facing sides of the encapsulation that form each of the inward channels 118. An outward channel width 128 is defined as a perpendicular distance between facing sides of the encapsulation that form each of the outward channels 122.

For illustrative purposes, the inward channel width 126 of the inward channels 118 is shown to be greater than the outward channel width 128 of the outward channels 122. The inward channel width 126 and the outward channel width 128 can be different. For example, the inward channel width 126 can be less than the outward channel width 128.

Figure 2:
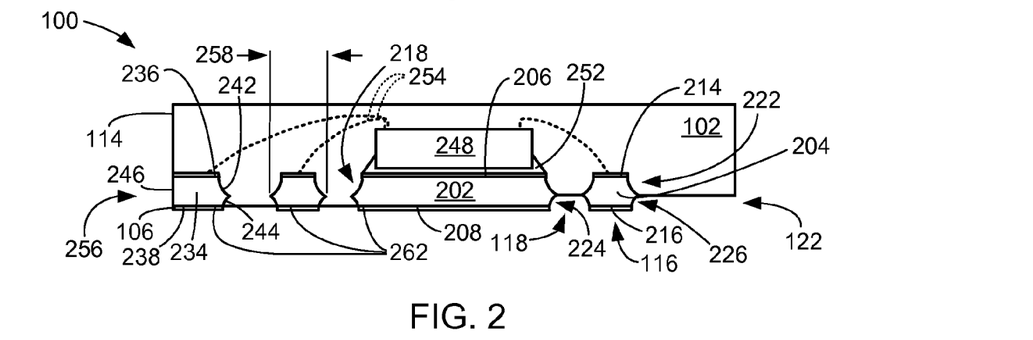
FIG. 2 is a cross-sectional view of a slice of FIG. 1 taken along line 2-2.

Referring now to FIG. 2, therein is shown a cross-sectional view of a slice of FIG. 1 taken along line 2-2. The integrated circuit packaging system 100 includes a die paddle 202 surrounded by the inner leads 204. The die paddle 202 can be formed from a conductive material that can include a copper or a copper alloy. The conductive material can have a thickness between one hundred microns and two hundred microns.

The die paddle 202 includes a paddle component side 206 opposite a paddle system side 208. The paddle component side 206 or the paddle system side 208 can be covered with the pre-plated finish 106. The pre-plated finish 106 has a thickness less than three microns.

For example, the pre-plated finish 106 can have a thickness less than a micron in thickness and can be considered in a plane having a side of the die paddle 202.

The inner leads 204 can be formed from the conductive material or a material having similar properties as the conductive material. The inner leads 204 formed within the offset areas 116 include an inner lead component side 214 opposite an inner lead system side 216.

The inner lead component side 214 or the inner lead system side 216 can be covered with the pre-plated finish 106. The inner lead system side 216 can be coplanar with the paddle system side 208. The inner lead component side 214 can be coplanar with the paddle component side 206.

A paddle internal section 218 of the die paddle 202 and an inner lead internal section 222 of the inner leads 204 can include concave sides. An end of the paddle internal section 218 intersects and surrounds the paddle component side 206. An end of the inner lead internal section 222 intersects and surrounds the inner lead component side 214.

A paddle external section 224 of the die paddle 202 opposite the paddle internal section 218 and an inner lead external section 226 of the inner leads 204 opposite the inner lead internal section 222 can include concave sides. An end of the paddle external section 224 intersects and surrounds the paddle system side 208. An end of the inner lead external section 226 intersects and surrounds the inner lead system side 216.

A thickness of the paddle internal section 218 can be greater than twice a thickness of the paddle external section 224. A thickness of the inner lead internal section 222 can be greater than twice a thickness of the inner lead external section 226.

For illustrative purposes, the paddle internal section 218, the inner lead internal section 222, the paddle external section 224, and the inner lead external section 226 are shown and described as having concave sides. The paddle internal section 218, the inner lead internal section 222, the paddle external section 224, or the inner lead external section 226 can have sides of any shape. For example, the paddle internal section 218 can have a tapered side or the inner lead internal section 222 can have multiple curved or angled sides.

Outer leads 234 can be formed outside a perimeter region having the die paddle 202 and the inner leads 204 of FIG. 2. The outer leads 234 can be formed from the conductive material or a material having similar properties as the conductive material. The outer leads 234 formed within the outer areas 112 of FIG. 1 include an outer lead component side 236 opposite an outer lead system side 238.

The outer lead component side 236 or the outer lead system side 238 can be covered with the pre-plated finish 106. The outer lead system side 238 can be coplanar with the paddle system side 208. The outer lead component side 236 can be coplanar with the paddle component side 206.

The outer leads 234 can include an outer lead internal section 242 and an outer lead external section 244 with concave sides in a manner similar to the paddle internal section 218 and the paddle external section 224, respectively. An end of the outer lead internal section 242 intersects and surrounds the outer lead component side 236. An end of the outer lead external section 244 intersects and surrounds the outer lead system side 238.

A thickness of the outer lead internal section 242 can be greater than twice a thickness of the outer lead external section 244. The outer leads 234 also include a flat non-horizontal side 246.

An integrated circuit device 248 can be mounted over the pre-plated finish 106 on the paddle component side 206 using an attachment layer 252. The attachment layer 252 can include an adhesive layer, a stacking adhesive, or a combination thereof Interconnects 254 (shown as hidden lines) can be directly attached or connected to circuitry of the integrated circuit device 248 and the pre-plated finish 106 on the inner lead component side 214 or on the outer lead component side 236. The interconnects 254 can include wire, wire bond wire, or a combination thereof The encapsulation 102 covers and surrounds the concave sides of the paddle internal section 218, the integrated circuit device 248, the interconnects 254, the attachment layer 252, and the inner lead internal section 222, the outer lead internal section 242, and the outer lead external section 244. The flat non-horizontal side 246 of the outer leads 234 is coplanar with and exposed from the encapsulation sides 114.

Sections of the inner lead external section 226 and the paddle external section 224 can be exposed at ends of the inward channels 118 and at an end of the outward channels 122. Each of the inward channels 118 can be used to electrically isolate the inner leads 204.

The pre-plated finish 106, the outer leads 234, the inner leads 204, and the die paddle 202 can be defined as a base structure 256 of the integrated circuit packaging system 100. An inner lead length 258 is defined as a maximum distance between an edge of the inner leads 204 closest to the die paddle 202 and an edge of the inner leads 204 closest to the encapsulation sides 114. The base structure system side 262 can be defined as the paddle system side 208, the inner lead system side 216, and the outer lead system side 238.

It has been discovered that the inner lead internal section 222 and the inner lead external section 226 protrude from sides of the inner leads 204 that improve reliability and stability of the integrated circuit packaging system 100 by reducing pullout or movement of the inner leads 204.

It has also been discovered that the outer lead internal section 242 and the outer lead external section 244 protrude from sides of the outer leads 234 that improve reliability and stability of the integrated circuit packaging system 100 by reducing pullout or movement of the outer leads 234.

It has further been discovered that the pre-plated finish 106 having a thickness less than a micron maintains a substantially planar surface providing a consistent seal between a mold chase (not shown) and a bottom surface of the package, thus preventing the encapsulation 102 from forming on the bottom surface.

It has yet further been discovered that the paddle internal section 218 and the paddle external section 224 protrude from sides of the die paddle 202 that improve reliability and stability of the integrated circuit packaging system 100 by reducing pullout or movement of the die paddle 202.

It has yet further been discovered that the base structure 256 provides superior mold interlocking capabilities with the encapsulation 102 resulting in the elimination of weak lead-pull and potential lead pull-out issues with any portion of the base structure 256.

Figure 3:
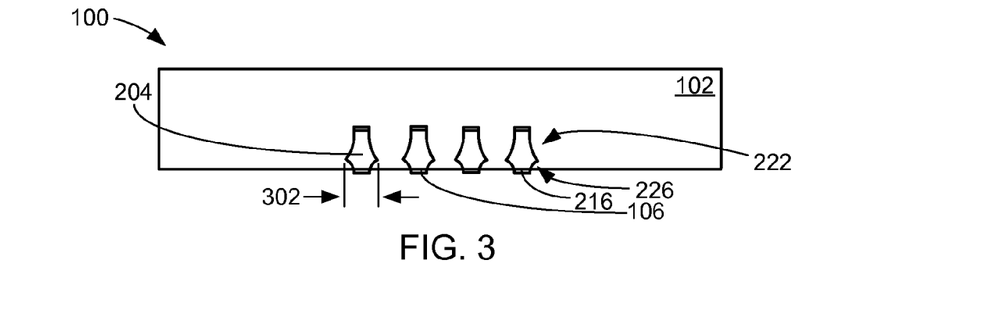
FIG. 3 is a cross-sectional view of FIG. 1 taken along line 3-3.

Referring now to FIG. 3, therein is shown a cross-sectional view of FIG. 1 taken along line 3-3. The inner leads 204 are shown with the pre-plated finish 106 exposed from the encapsulation 102. An inner lead width 302 is defined as a maximum distance between sides of the inner leads 204 measured perpendicularly to the inner lead length 258 of FIG. 2.

The inner lead length 258 of FIG. 2 can be more than three times the inner lead width 302. Opposite sides of the inner lead external section 226 and the inner lead internal section 222 can be covered by the encapsulation 102.

Figure 4:
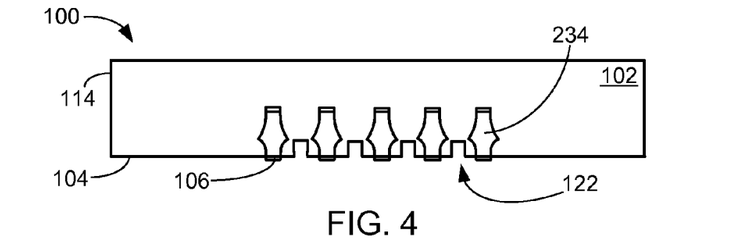
FIG. 4 is a cross-sectional view of FIG. 1 taken along line 4-4.

Referring now to FIG. 4, therein is shown a cross-sectional view of FIG. 1 taken along line 4-4. A cross-section of the outer leads 234 can be exposed from the encapsulation sides 114 of the encapsulation 102. The pre-plated finish 106 on the outer leads 234 is shown exposed from the base surface 104 of the encapsulation 102. Ends of the outward channels 122 that form the inner leads 204 can be exposed from the encapsulation sides 114.

The pre-plated finish 106 has a thickness less than three microns. For example, the pre-plated finish 106 can have a thickness less than a few microns or less than a micron in thickness.

For purposes of illustration, the pre-plated finish 106 is shown coplanar with the base surface 104. The pre-plated finish 106 can be below or above the base surface 104. For example, the pre-plated finish 106 can protrude above the base surface 104 to form a stand-off height for the integrated circuit packaging system 100.

Figure 5:
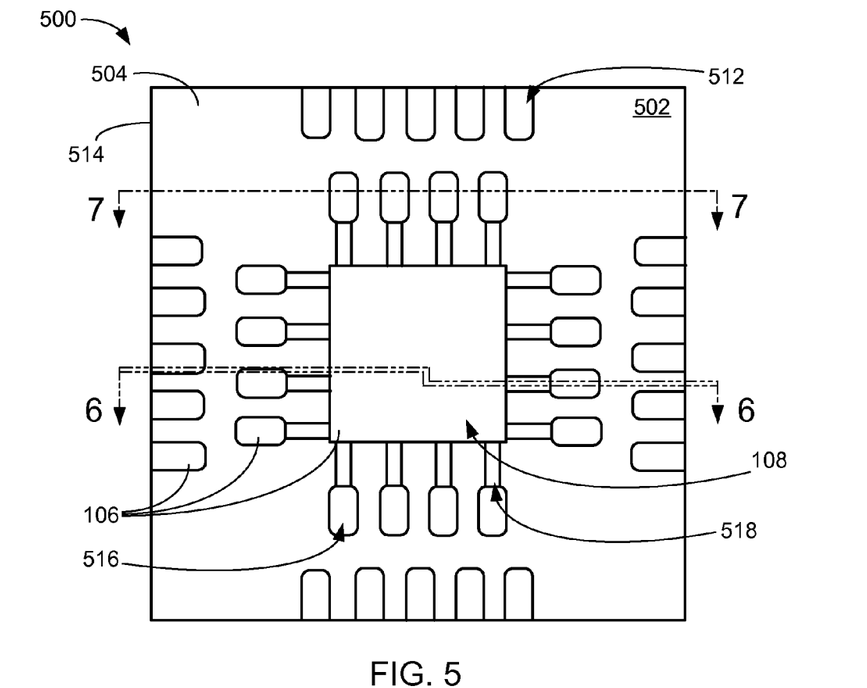
FIG. 5 is a bottom view of an integrated circuit packaging system in a second embodiment of the present invention.

Referring now to FIG. 5, therein is shown a bottom view of an integrated circuit packaging system 500 in a second embodiment of the present invention. The integrated circuit packaging system 500 includes an encapsulation 502 with a base surface 504 and the pre-plated finish 106 formed over different areas of the base surface 504 using conductive materials that can include Nickel, Palladium, gold, or in any combination with electrically conductive materials.

The encapsulation 502 can be used to protect and hermetically seal the contents of the integrated circuit packaging system 500. The pre-plated finish 106 is applied on a material to protect the material from damage that can include chemical etchants, corrosion, oxidation, or abrasions.

The pre-plated finish 106 can be exposed at the component area 108 over the base surface 504 and at outer areas 512 along a perimeter of the integrated circuit packaging system 500. The pre-plated finish 106 at the outer areas 512 intersects encapsulation sides 514 of the integrated circuit packaging system 500. The component area 108 and each of the outer areas 512 are individually separated from one another by the base surface 504.

Offset areas 516 over the base surface 504 having the pre-plated finish 106 can be located between the component area 108 and the outer areas 512 along the perimeter. Each of the offset areas 516 are individually separated from one another, the component area 108, and the outer areas 512 of FIG. 5 by the base surface 504.

Inward channels 518 are formed in the encapsulation 502. Each of the inward channels 518 is defined as a groove or indentation formed from the base surface 504 into the encapsulation 502. A length of the inward channels 518 can extend perpendicularly from an edge of the pre-plated finish 106 at the component area 108 to an edge of the pre-plated finish 106 of the offset areas 516.

Figure 6:
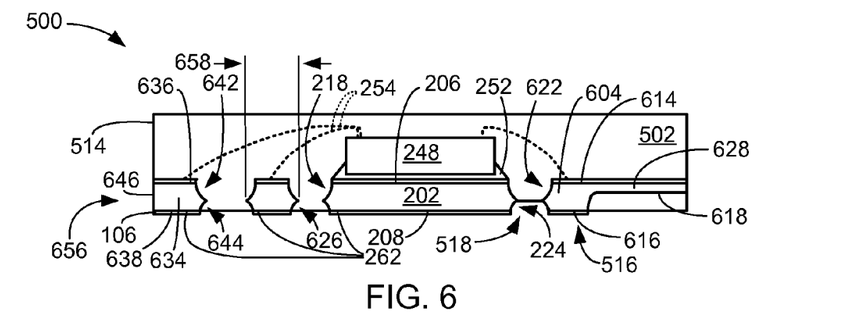
FIG. 6 is a cross-sectional view of a slice of FIG. 5 taken along line 6-6.

Referring now to FIG. 6, therein is shown a cross-sectional view of a slice of FIG. 5 taken along line 6-6. The integrated circuit packaging system 500 includes the die paddle 202 surrounded by inner leads 604. The die paddle 202 includes the pre-plated finish 106 on the paddle component side 206 opposite the paddle system side 208.

The paddle internal section 218 and the paddle external section 224 can include concave sides. The thickness of the paddle internal section 218 can be greater than twice a thickness of the paddle external section 224.

The inner leads 604 can be formed from the conductive material of the die paddle 202 or a material having similar properties as the conductive material. The inner leads 604 formed within the offset areas 516 include an inner lead component side 614 opposite an inner lead system side 616. The inner lead component side 614 extends laterally from the offset areas 516 to the encapsulation sides 514.

An inner lead intermediate side 618 of the inner leads 604 can be formed parallel to the inner lead component side 614 and extend laterally from the offset areas 516 to the encapsulation sides 514. The inner lead intermediate side 618 is located between the inner lead component side 614 and the inner lead system side 616.

The inner lead component side 614 or the inner lead system side 616 can be covered with the pre-plated finish 106. The inner lead system side 616 can be coplanar with the paddle system side 208. The inner lead component side 614 can be coplanar with the paddle component side 206.

An inner lead internal section 622 of the inner leads 604 and an inner lead external section 626 of the inner leads 604 opposite the inner lead internal section 622 can include concave sides. An end of the inner lead intermediate side 618 furthest from the encapsulation sides 514 is abutted to a section of the inner lead external section 626 closets to and facing the encapsulation sides 514. The inner lead intermediate side 618 and a section of the inner lead component side 614 form a platform extension 628 of the inner leads 604.

A thickness of the inner lead internal section 622 can be greater than twice a thickness of the inner lead external section 626. A thickness of the platform extension 628 can be equal to or less than the thickness of the inner lead external section 626.

For illustrative purposes, the paddle internal section 218, the inner lead internal section 622, the paddle external section 224, and the inner lead external section 626 are shown and described as having concave sides. The paddle internal section 218, the inner lead internal section 622, the paddle external section 224, or the inner lead external section 626 can have sides of any shape. For example, the paddle internal section 218 can have a tapered side or the inner lead internal section 622 can have multiple curved or angled sides.

Outer leads 634 can be formed outside a perimeter region having the die paddle 202 and the inner leads 604 of FIG. 6. The outer leads 634 can be formed from the conductive material or a material having similar properties as the conductive material. The outer leads 634 formed within the outer areas 512 of FIG. 5 include an outer lead component side 636 opposite an outer lead system side 638.

The outer lead component side 636 or the outer lead system side 638 can be covered with the pre-plated finish 106. The outer lead system side 638 can be coplanar with the paddle system side 208. The outer lead component side 636 can be coplanar with the paddle component side 206.

The outer leads 634 can include an outer lead internal section 642 and an outer lead external section 644 with concave sides in a manner similar to the paddle internal section 218 and the paddle external section 224, respectively. A thickness of the outer lead internal section 642 can be greater than twice a thickness of the outer lead external section 644. The outer leads 634 also include a flat non-horizontal side 646.

The integrated circuit device 248 can be mounted over the pre-plated finish 106 on the paddle component side 206 using the attachment layer 252. The interconnects 254 (shown as hidden lines) can be attached to circuitry of the integrated circuit device 248 and the pre-plated finish 106 on the inner lead component side 614 or on the outer lead component side 636.

The encapsulation 502 covers the concave sides of the paddle internal section 218, the integrated circuit device 248, the interconnects 254, the attachment layer 252, and the inner lead internal section 622, the outer lead internal section 642, the outer lead external section 644, and the inner lead intermediate side 618. The flat non-horizontal side 646 of the outer leads 634 is coplanar with and exposed from the encapsulation sides 514. Sections of the inner lead external section 626 and the paddle external section 224 can be exposed at ends of the inward channels 518. Each of the inward channels 518 can be used to electrically isolate the inner leads 604.

The pre-plated finish 106, the outer leads 634, the inner leads 604, and the die paddle 202 can be defined as a base structure 656 of the integrated circuit packaging system 500. An inner lead length 658 is defined as a maximum distance between an edge of the inner leads 604 closest to the die paddle 202 and an edge of the inner leads 604 closest to the encapsulation sides 514. The base structure system side 662 can be defined as the paddle system side 208, the inner lead system side 616, and the outer lead system side 638.

It has been discovered that the inner lead internal section 622, the inner lead external section 626, and the platform extension 628 protrude from sides of the inner leads 604 that improve reliability and stability of the integrated circuit packaging system 500 by reducing pullout or movement of the inner leads 604.

It has also been discovered that the outer lead internal section 642 and the outer lead external section 644 protrude from sides of the outer leads 634 that improve reliability and stability of the integrated circuit packaging system 500 by reducing pullout or movement of the outer leads 634.

It has further been discovered that the pre-plated finish 106 having a thickness less than a micron maintains a substantially planar surface providing a consistent seal between a mold chase (not shown) and a bottom surface of the package, thus preventing the encapsulation 502 from forming on the bottom surface.

It has yet further been discovered that the paddle internal section 218 and the paddle external section 224 protrude from sides of the die paddle 202 that improve reliability and stability of the integrated circuit packaging system 500 by reducing pullout or movement of the die paddle 202.

It has yet further been discovered that the base structure 656 provides superior mold interlocking capabilities with the encapsulation 502 resulting in the elimination of weak lead-pull and potential lead pull-out issues with any portion of the base structure 656.

Figure 7:
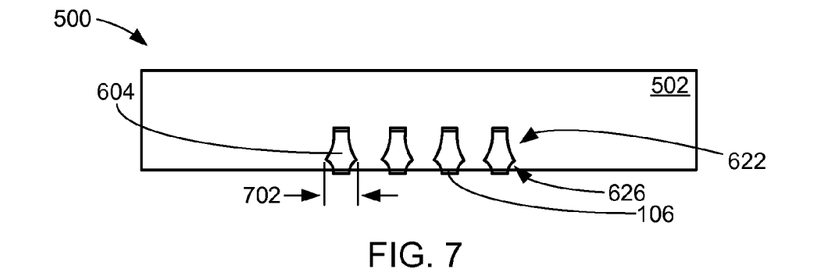
FIG. 7 is a cross-sectional view of FIG. 5 taken along line 7-7.

Referring now to FIG. 7, therein is shown a cross-sectional view of FIG. 5 taken along line 7-7. The inner leads 604 are shown with the pre-plated finish 106 exposed from the encapsulation 502. An inner lead width 702 is defined as a maximum distance between sides of the inner leads 604 measured perpendicularly to the inner lead length 658 of FIG. 6.

The inner lead length 658 can be more than three times the inner lead width 702. Opposite sides of the inner lead external section 626 and the inner lead internal section 622 can be covered by the encapsulation 502.

Figure 8:
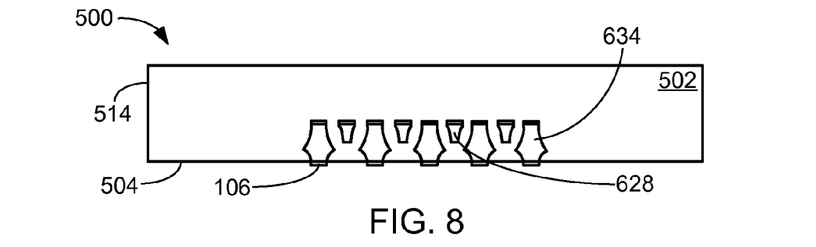
FIG. 8 is a side view of FIG. 5.

Referring now to FIG. 8, therein is shown a side view of FIG. 5. A cross-section of the outer leads 634 can be exposed from the encapsulation sides 514 of the encapsulation 502. The pre-plated finish 106 on the outer leads 634 is exposed from the base surface 504 of the encapsulation 502. Ends of the platform extension 628 of the inner leads 604 of FIG. 6 can be exposed from the encapsulation sides 514.

For purposes of illustration, the pre-plated finish 106 is shown coplanar with the base surface 504. The pre-plated finish 106 can be below or above the base surface 504. For example, the pre-plated finish 106 can protrude above the base surface 504 to form a stand-off height for the integrated circuit packaging system 500.

Figure 9:
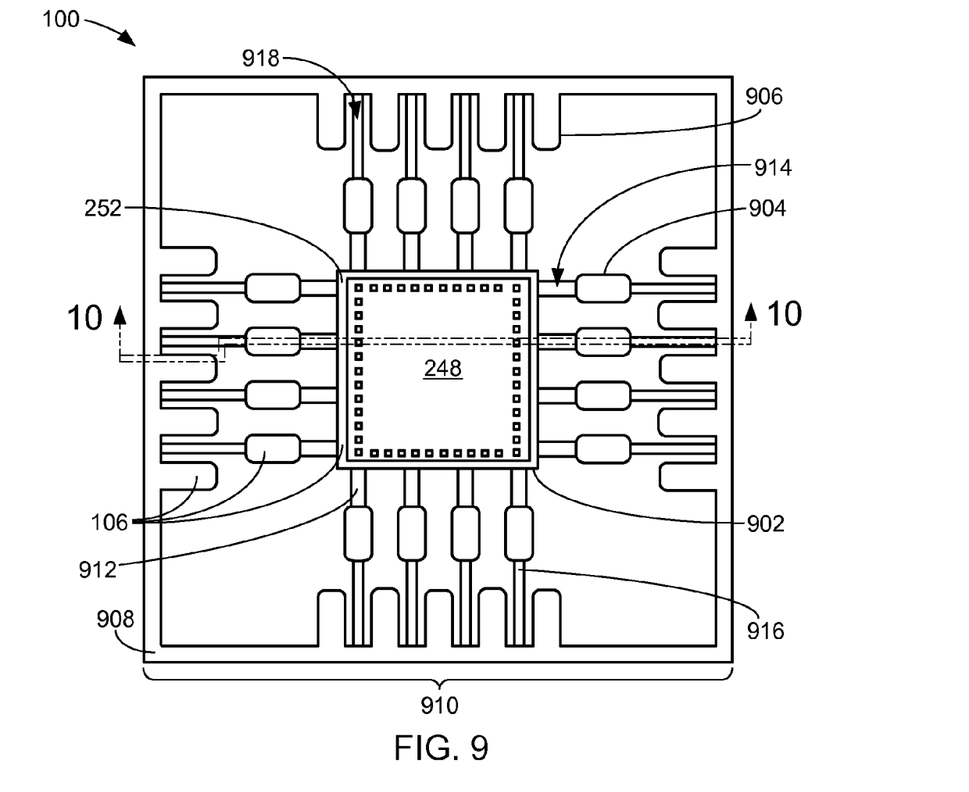
FIG. 9 is a top view of FIG. 1 in a leadframe mounting phase of manufacture.

Referring now to FIG. 9, therein is shown a top view of FIG. 1 in a leadframe mounting phase of manufacture. The pre-plated finish 106 is shown on a die paddle 902, inner leads 904, outer leads 906, and a perimeter frame 908 of a leadframe 910. The leadframe 910 can be formed from a conductive material that can include a copper or a copper alloy. The perimeter frame 908 can used to strengthen the leadframe 910 during the manufacturing process.

An inward lead support 912 of the leadframe 910 is located directly between facing sides of the inner leads 904 and of the die paddle 902. Ends of the inward lead support 912 are abutted and joined to the facing sides of the inner leads 904 and of the die paddle 902. The inward lead support 912 is exposed from the pre-plated finish 106.

The inward lead support 912 includes an inward lead depression 914 formed in the inward lead support 912. The inward lead depression 914 can be formed using a removal process that can include an etching, a grinding, a cutting, or a similar material removal process.

An outward lead support 916 of the leadframe 910 is located directly between facing sides of the inner leads 904 and the perimeter frame 908. Ends of the outward lead support 916 are abutted and joined to the facing sides of the inner leads 904 and of the perimeter frame 908. The outward lead support 916 is exposed from the pre-plated finish 106.

The outward lead support 916 includes an outward lead depression 918 formed in the outward lead support 916. The outward lead depression 918 can be formed using a removal process that can include an etching, a grinding, a cutting, or a similar material removal process. Sides of the outer leads 906 facing away and furthest away from the die paddle 902 are abutted and joined to sides of the perimeter frame 908 facing the die paddle 902.

The integrated circuit device 248 is mounted over the pre-plated finish 106 on the die paddle 902 using the attachment layer 252 during lead mounting phase. The lead mounting phase can include a cleaning, heating, or cooling process.

Figure 10:
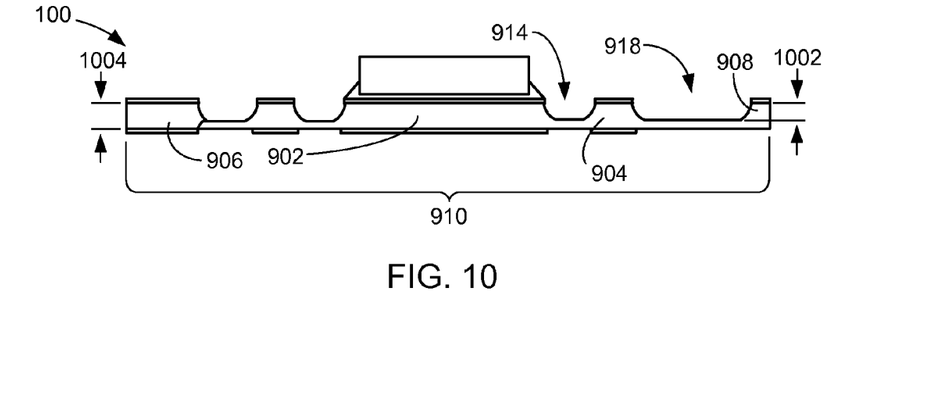
FIG. 10 is a cross-sectional view of a slice of FIG. 9 taken along line 10-10.

Referring now to FIG. 10, therein is shown a cross-sectional view of a slice of FIG. 9 taken along line 10-10. The inward lead depression 914 is shown between the die paddle 902 and the inner leads 904. The outward lead depression 918 is shown between the inner leads 904 and the outer leads 906.

The inward lead depression 914 or the outward lead depression 918 of the leadframe 910 can be formed having an inward lead depression depth 1002 greater than one-half of the perimeter frame thickness 1004 of the perimeter frame 908. The outer leads 906 can have a thickness equal to the perimeter frame thickness 1004. The perimeter frame thickness can be in a range of one hundred to two hundred microns thick.

Figure 11:
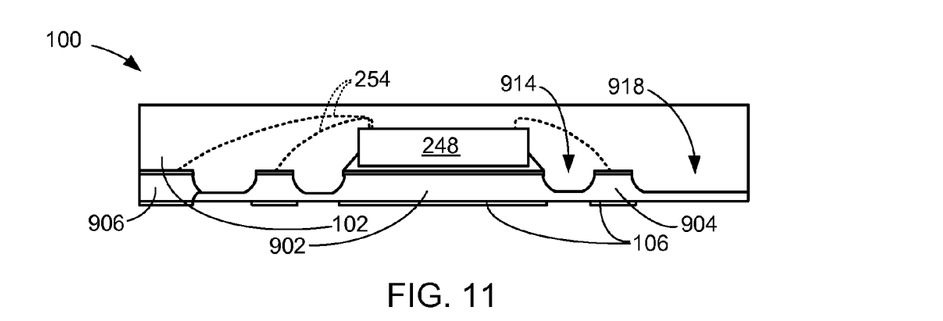
FIG. 11 is the cross-sectional view of the slice of FIG. 10 in an encapsulation finishing phase.

Referring now to FIG. 11, therein is shown the cross-sectional view of the slice of FIG. 10 in an encapsulation finishing phase. The interconnects 254 can be attached or connected directly to the integrated circuit device 248 over the die paddle 902 and to the inner leads 904 or the outer leads 906 in a manner similar to the inner leads 204 of FIG. 2 or the outer leads 234 of FIG. 2 using a connecting process. The connecting process can include a bonding, a stitching, or a reflow process.

The encapsulation 102 can cover the interconnects 254, the integrated circuit device 248, the inner leads 904, and the outer leads 906. The encapsulation 102 can fill the inward lead depression 914 and the outward lead depression 918. The perimeter frame 908 of FIG. 10 can be removed from the leadframe 910 of FIG. 10 using a separation process that can include a sawing, a grinding, a cutting, or a punching process.

It has been discovered that the inward lead support 912 of FIG. 9, the outward lead support 916 of FIG. 9, the die paddle 902, and the perimeter frame 908 prevents damage of the inner leads 904 caused by handling or assembly processing. The inward lead support 912 of the inner leads 904 abutted and joined to the die paddle 902 combined with the outward lead support 916 of the inner leads 904 abutted and joined to the perimeter frame 908 prevents connection damage of the inner leads 904 by eliminating resonant frequencies during ultrasonic generation (USG) bonding during at remote leads.

It has also been discovered that the inward lead support 912, the outward lead support 916, the die paddle 902, and the perimeter frame 908 increases the reliability and yield of any leadframe based package by eliminating the need for cover-lay tape during manufacturing. Elimination of the cover-lay tape from manufacturing prevents reliability and yield issues from tape related usage that include contamination of the leadframe bonding surfaces from adhesive material of the tape and the tape exposure to plasma based processing.

It has further been discovered that the inward lead support 912 of the inner leads 904 abutted and joined to the die paddle 902 combined with the outward lead support 916 of the inner leads 904 abutted and joined to the perimeter frame 908 eliminates weak stitch bonds by eliminating resonance.

Figure 12:
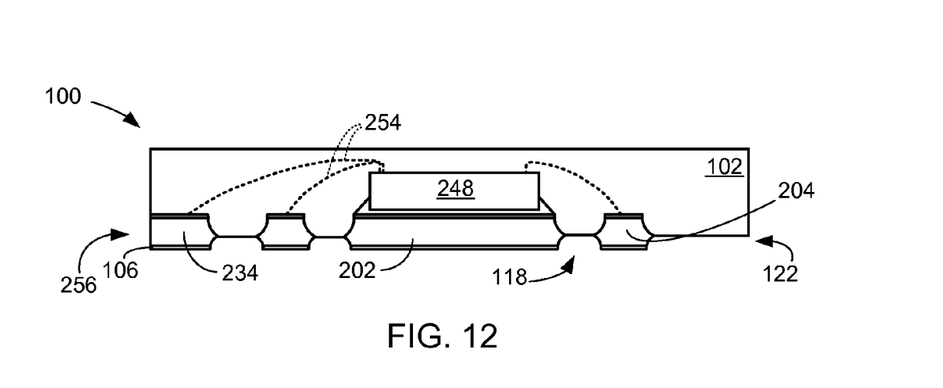
FIG. 12 is the cross-sectional view of the slice of FIG. 11 in a lead forming phase.

Referring now to FIG. 12, therein is shown the cross-sectional view of the slice of FIG. 11 in a lead forming phase.

The base structure 256 can be formed by removal of portions of the conductive material exposed around the pre-plated finish 106 using the removal process. The removal process results in the formation of the integrated circuit packaging system 100 of FIG. 1.

Shown is the base structure 256 with the pre-plated finish 106 on the base structure 256 and exposed from the encapsulation 102. The integrated circuit device 248 is shown mounted over the die paddle 202 of the base structure 256.

The interconnects 254 are shown connecting or attaching the integrated circuit device 248 to the inner leads 204 or the outer leads 234 of the base structure 256. The encapsulation 102 is shown over the base structure 256, the interconnects 254, and the integrated circuit device 248. The inward channels 118 and the outward channels 122 are shown formed in the encapsulation 102 as the result of the removal of the portions of the conductive material.

It has been discovered that the base structure 256 provides dual row quad flat no lead leadframe packages with improved inner lead stability which results in improved wirebond stitch reliability and assembly processing by eliminating resonance.

Figure 13:
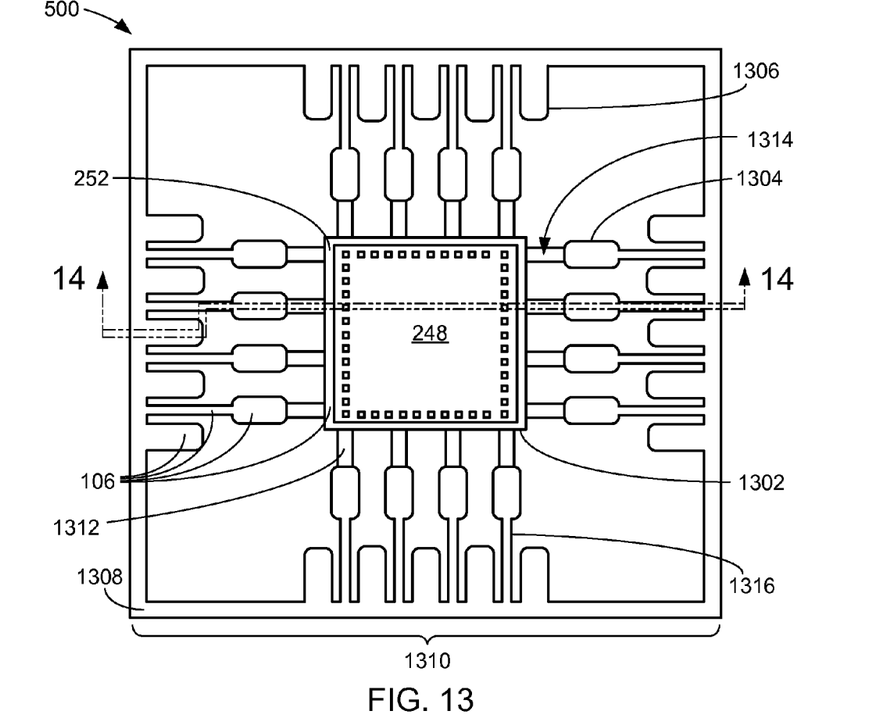
FIG. 13 is a top view of FIG. 5 in a leadframe mounting phase of manufacture.

Referring now to FIG. 13, therein is shown a top view of FIG. 5 in a leadframe mounting phase of manufacture. The pre-plated finish 106 is shown on a die paddle 1302, inner leads 1304, outer leads 1306, and a perimeter frame 1308 of a leadframe 1310. The leadframe 1310 can be formed from a conductive material that can include a copper or a copper alloy. The perimeter frame 1308 can used to strengthen the leadframe 1310 during the manufacturing process.

An inward lead support 1312 of the leadframe 1310 is located directly between facing sides of the inner leads 1304 and of the die paddle 1302. Ends of the inward lead support 1312 are abutted and joined to the facing sides of the inner leads 1304 and of the die paddle 1302. The inward lead support 1312 is exposed from the pre-plated finish 106.

The inward lead support 1312 includes an inward lead depression 1314 formed in the inward lead support 1312. The inward lead depression 1314 can be formed using a removal process that can include an etching, a grinding, a cutting, or a similar material removal process.

A platform extension 1316 of the inner leads 1304 is shown extending from each of the inner leads 1304 to a side of the perimeter frame 1308 closets to the inner leads 1304. The platform extension 1316 is perpendicular to the side of the perimeter frame 1308. An end of the platform extension 1316 furthest away from the inner leads 1304 is abutted and joined to the perimeter frame 1308. The platform extension 1316 is covered with the pre-plated finish 106.

Sides of the outer leads 1306 facing away and furthest away from the die paddle 1302 are abutted and joined to sides of the perimeter frame 1308 facing the die paddle 1302.

The integrated circuit device 248 is mounted over the pre-plated finish 106 on the die paddle 1302 using the attachment layer 252 during lead mounting phase. The lead mounting phase can include a cleaning, heating, or cooling process.

Figure 14:
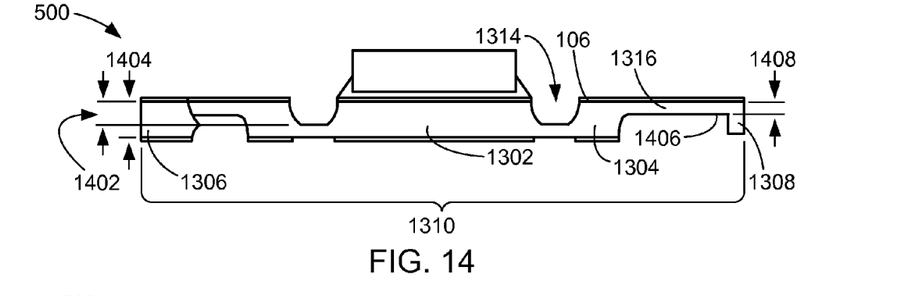
FIG. 14 is a cross-sectional view of a slice of FIG. 13 taken along line 14-14.

Referring now to FIG. 14, therein is shown a cross-sectional view of a slice of FIG. 13 taken along line 14-14. The inward lead depression 1314 is shown between the die paddle 1302 and the inner leads 1304. The inward lead depression 1314 of the leadframe 1310 can be formed having an inward lead depression depth 1402 greater than one-half of the perimeter frame thickness 1404 of the perimeter frame 1308.

A portion of a side of the platform extension 1316 opposite a side of the platform extension 1316 having the pre-plated finish 106 can be removed to form an inner lead intermediate side 1406 of the platform extension 1316 using the removal process. The removal process results in the platform extension 1316 having a platform thickness 1408 less than one-half of the perimeter frame thickness 1404. The outer leads 1306 can have a thickness equal to the perimeter frame thickness 1404.

Figure 15:
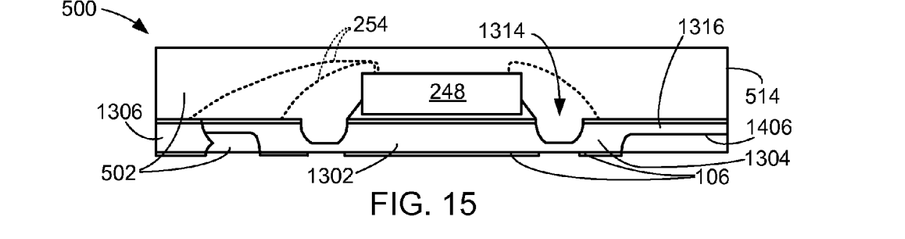
FIG. 15 is the cross-sectional view of the slice of FIG. 14 in an encapsulation finishing phase.

Referring now to FIG. 15, therein is shown the cross-sectional view of the slice of FIG. 14 in an encapsulation finishing phase. The interconnects 254 can be attached or connected directly to the integrated circuit device 248 over the die paddle 1302 and to the inner leads 1304 or the outer leads 1306 in a manner similar to the inner leads 604 of FIG. 6 or the outer leads 634 of FIG. 6 using a connecting process. The connecting process can include a bonding, a stitching, or a reflow process.

The encapsulation 502 can cover the interconnects 254, the integrated circuit device 248, the inner leads 1304, and the outer leads 1306. The encapsulation 502 can fill the inward lead depression 1314 and cover the inner lead intermediate side 1406 of the platform extension 1316. The perimeter frame 1308 of FIG. 14 can be removed from the leadframe 1310 of FIG. 14 using a separation process similar to a standard quad flat no lead saw singulation that can include a sawing, grinding, or cutting process. A section of the platform extension 1316 is exposed from the encapsulation sides 514 as a result of the separation process.

It has been discovered that the inward lead support 1312 of FIG. 13, the platform extension 1316, the die paddle 1302, and the perimeter frame 1308 prevents damage of the inner leads 1304 caused by handling or assembly processing. The inward lead support 1312 of the inner leads 1304 abutted and joined to the die paddle 1302 combined with the platform extension 1316 of the inner leads 904 abutted and joined to the perimeter frame 1308 prevents connection damage of the inner leads 1304 by eliminating resonant frequencies during ultrasonic generation (USG) bonding during at remote leads.

It has also been discovered that the inward lead support 1312, the platform extension 1316, the die paddle 1302, and the perimeter frame 1308 increases the reliability and yield of any leadframe based package by eliminating the need for cover-lay tape during manufacturing. Elimination of the cover-lay tape from manufacturing prevents reliability and yield issues from tape related usage that include contamination of the leadframe bonding surfaces from adhesive material of the tape and the tape exposure to plasma based processing.

It has further been discovered that the inward lead support 1312 of the inner leads 1304 abutted and joined to the die paddle 1302 combined with the platform extension 1316 of the inner leads 1304 abutted and joined to the perimeter frame 1308 eliminates weak stitch bond by eliminating resonance.

Figure 16:
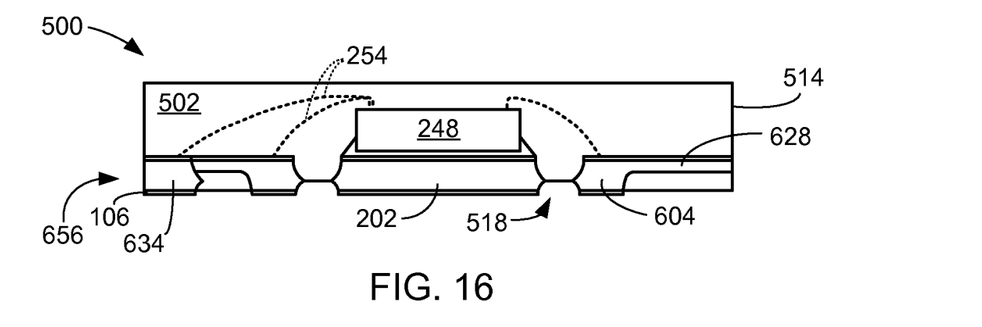
FIG. 16 is the cross-sectional view of the slice of FIG. 15 in a lead forming phase.

Referring now to FIG. 16, therein is shown the cross-sectional view of the slice of FIG. 15 in a lead forming phase. The base structure 656 can be formed by removal of portions of the conductive material exposed around the pre-plated finish 106 using the removal process. The removal process results in the formation of the integrated circuit packaging system 500 of FIG. 6.

Shown is the base structure 656 with the pre-plated finish 106 on the base structure 656 and exposed from the encapsulation 502. The integrated circuit device 248 is shown mounted over the die paddle 202 of the base structure 656.

The interconnects 254 are shown connecting or attaching the integrated circuit device 248 to the inner leads 604 or the outer leads 634 of the base structure 656. The encapsulation 502 is shown over the base structure 656, the interconnects 254, and the integrated circuit device 248. The inward channels 518 are shown formed in the encapsulation 502 as the result of the removal of the portions of the conductive material. The platform extension 628 of the inner leads 604 is covered with the encapsulation 502 except for ends of the platform extension 628 that are exposed from the encapsulation sides 514.

It has been discovered that the base structure 656 provides dual row quad flat no lead leadframe packages with improved inner lead stability which results in improved wirebond stitch reliability and assembly by eliminating resonance.

Figure 17:
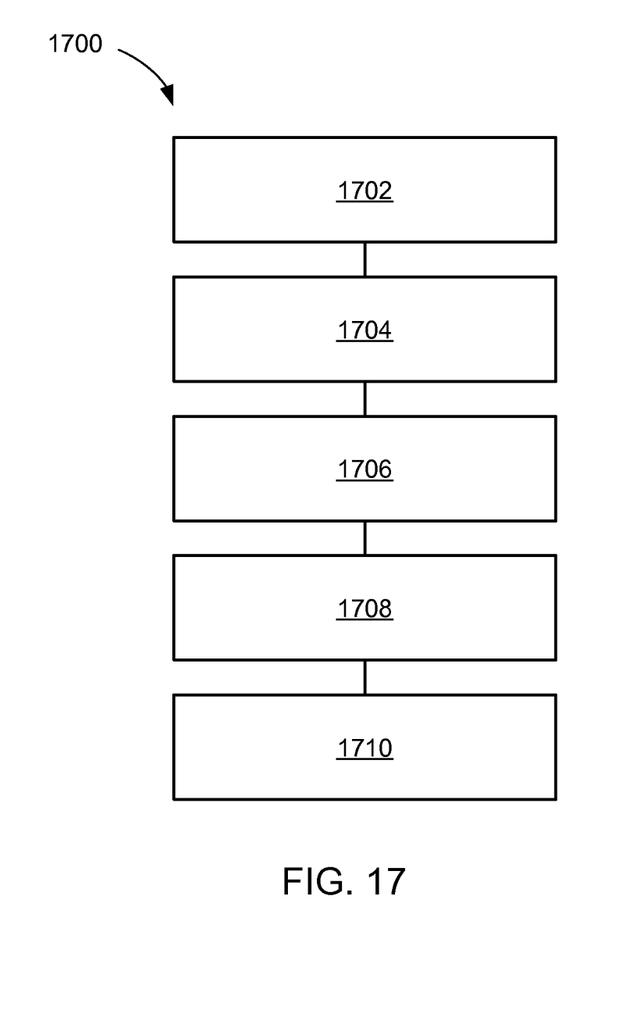
FIG. 17 is a flow chart of a method of manufacture of the integrated circuit packaging system in a further embodiment of the present invention.

Referring now to FIG. 17, therein is shown is a flow chart of a method 1700 of manufacture of the integrated circuit packaging system 100 in a further embodiment of the present invention. The method 1700 includes: forming a base structure having a die paddle, an outer lead, and an inner lead between the die paddle and the outer lead, with a pre-plated finish on a base structure system side of the base structure in a block 1702; mounting an integrated circuit device to a side of the die paddle opposite the paddle system side in a block 1704; attaching an interconnect to the integrated circuit device and a side of the inner lead opposite the inner lead system side in a block 1706; applying an encapsulation around the integrated circuit device, the interconnect, and the base structure with the pre-plated finish exposed from the encapsulation in a block 1708; and forming an inward channel in the encapsulation to electrically isolate the inner lead in a block 1710.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a base structure having a die paddle, an outer lead, and an inner lead between the die paddle and the outer lead, with a pre-plated finish on a base structure system side of the base structure;
    mounting an integrated circuit device to a side of the die paddle opposite the paddle system side;
    attaching an interconnect to the integrated circuit device and a side of the inner lead opposite the inner lead system side;
    applying an encapsulation around the integrated circuit device, the interconnect, and the base structure with a flat non-horizontal side of the outer lead and the pre-plated finish exposed from the encapsulation; and
    forming an inward channel in the encapsulation to electrically isolate the inner lead.

2. The method as claimed in claim 1 further comprising forming an outward channel in the encapsulation on a side of the inner lead opposite the inward channel.

3. The method as claimed in claim 1 wherein forming the inner lead of the base structure includes forming the inner lead having a platform extension.

4. The method as claimed in claim 1 further comprising forming an outward channel in the encapsulation, the outward channel having an outward channel width less than an inward channel width of the inward channel.

5. A method of manufacture of an integrated circuit packaging system comprising:
    forming a base structure having a die paddle, an outer lead, and an inner lead between the die paddle and the outer lead, with a pre-plated finish on a base structure system side of the base structure;
    mounting an integrated circuit device to a side of the die paddle opposite the paddle system side;
    attaching an interconnect to the integrated circuit device and a side of the inner lead opposite the inner lead system side;
    applying an encapsulation around the integrated circuit device, the interconnect, and the base structure with a flat non-horizontal side of the outer lead and the pre-plated finish exposed from the encapsulation; and
    forming an inward channel in the encapsulation to electrically isolate the inner lead exposing the paddle system side and the inner lead system side at ends of the inward channel.

6. The method as claimed in claim 5 further comprising forming an outward channel in the encapsulation on a side of the inner lead opposite the inward channel to electrically isolate the inner lead.

7. The method as claimed in claim 5 wherein forming the inner lead of the base structure includes forming the inner lead having a platform extension exposed from an encapsulation side of the encapsulation.

8. The method as claimed in claim 5 further comprising forming an outward channel in the encapsulation, the outward channel having an outward channel width greater than an inward channel width of the inward channel.

9. An integrated circuit packaging system comprising:
    a base structure having a die paddle, an outer lead, and an inner lead between the die paddle and the outer lead with a pre-plated finish on a base structure system side of the base structure;
    an integrated circuit device mounted to a side of the die paddle opposite the paddle system side;
    an interconnect attached to the integrated circuit device and a side of the inner lead opposite the inner lead system side;
    an encapsulation around the integrated circuit device, the interconnect, and the base structure, with a flat non-horizontal side of the outer lead and the pre-plated finish exposed from the encapsulation; and
    an inward channel in the encapsulation to electrically isolate the inner lead.

10. The system as claimed in claim 9 further comprising an outward channel in the encapsulation on a side of the inner lead opposite the inward channel.

11. The system as claimed in claim 9 wherein the inner lead includes a platform extension.

12. The system as claimed in claim 9 further comprising an outward channel in the encapsulation, the outward channel having an outward channel width less than an inward channel width of the inward channel.

13. The system as claimed in claim 9 wherein an inward channel in the encapsulation includes the paddle system side and the inner lead system side exposed at ends of the inward channel.

14. The system as claimed in claim 13 further comprising forming an outward channel in the encapsulation on a side of the inner lead opposite the inward channel to electrically isolate the inner lead.

15. The system as claimed in claim 13 wherein the inner lead includes a platform extension exposed from an encapsulation side of the encapsulation.

16. The system as claimed in claim 13 further comprising an outward channel in the encapsulation, the outward channel having an outward channel width greater than an inward channel width of the inward channel.

17. The system as claimed in claim 13 wherein the encapsulation over the base structure includes a flat non-horizontal side of the outer lead exposed from an encapsulation side of the encapsulation.

* * * * *